(12) United States Patent
Raz

(10) Patent No.: US 6,639,537 B1
(45) Date of Patent: Oct. 28, 2003

(54) HIGHLY LINEAR ANALOG-TO-DIGITAL CONVERSION SYSTEM AND METHOD THEREOF

(75) Inventor: Gil Moshe Raz, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/822,726

(22) Filed: Mar. 30, 2001

Related U.S. Application Data

(60) Provisional application No. 60/193,788, filed on Mar. 31, 2000.

(51) Int. Cl.[7] .............................................. H03M 1/12
(52) U.S. Cl. ........................ 341/155; 341/143; 375/341
(58) Field of Search ................... 341/143, 138, 341/155; 369/59; 375/341, 229

(56) References Cited

U.S. PATENT DOCUMENTS

| | | | | |
|---|---|---|---|---|
| 4,965,536 A | * | 10/1990 | Yoshida ...................... 332/103 |
| 5,789,689 A | * | 8/1998 | Doidic et al. ................ 341/138 |
| 5,929,795 A | * | 7/1999 | Wang .......................... 341/118 |
| 6,052,349 A | * | 4/2000 | Okamoto ................... 369/47.26 |
| 6,271,781 B1 | * | 8/2001 | Pellon ........................ 341/143 |
| 6,285,412 B1 | * | 9/2001 | Twitchell et al. ............ 348/608 |
| 6,335,767 B1 | * | 1/2002 | Twitchell et al. ............ 348/608 |
| 6,345,076 B1 | * | 2/2002 | Petersen et al. ............. 375/341 |
| 6,385,239 B1 | * | 5/2002 | Okamoto et al. ............ 375/232 |

* cited by examiner

*Primary Examiner*—Peguy Jeanpierre
(74) *Attorney, Agent, or Firm*—Samuels, Gauthier & Stevens, LLP

(57) ABSTRACT

A highly linear analog-to-digital (ADC) conversion system has an analog front-end device in cascade with a standard ADC converter, and a tunable digital non-linear equalizer. The equalizer corrects the quantization distortion, deviations from ideal response, and additive noises generated by the analog front-end device and ADC converter. The equalizer is formed by three main parts: Generate Function Streams Unit, Finite Impulse Response FIR filters and a summer. The equalizer receives the unequalized output from the ADC converter and generates a plurality of monomial streams in a systolic fashion. Each of the monomial streams is passed through a corresponding linear finite impulse response FIR filter. A convolution sum of all outputs from the FIR filters produces a unique equalized output with the non-linear distortion reduced to a satisfactory level. The FIR filter coefficients are determined by an Identity Equalizer Coefficient Unit, and a Test Signal Generator with different types of test signals. The FIR filter coefficients are set to minimize an error function.

48 Claims, 10 Drawing Sheets

HIGHLY LINEAR ANALOG-TO-DIGITAL CONVERSION SYSTEM AND METHOD THEREOF

CROSS-REFERENCE TO RELATED PROVISIONAL APPLICATION

The present patent application claims priority inder 35 U.S.C. §119 from U.S. Provisional Patent Application Ser. No. 60/193,788 filed on Mar. 31, 2000.

BACKGROUND OF THE PRESENT INVENTION

The present invention relates to the field of digital signal processing, and in particular to a highly linear analog to digital conversion system with a tunable non-linear digital equalizer for providing an output signal with reduced non-linear distortions.

Digital signal processing is an important technology in many applications including communications, consumer electronics, radar, and sonar. In many of these applications there is a need to convert analog signals into digital form via an analog-to-digital converter ("ADC") with analog front-end devices such as amplifiers. These ADC convert continuous-time analog signals into discrete-time (i.e., sampled,) quantized digital signals.

In order to perform well, these ADCs and front-end devices are required to produce as little distortion as possible in the output signal. Distortions present in the ADC's output signal can broadly be categorized as resulting from three sources:

a) Quantization distortion. Quantization distortion is the distortion caused by the ADC by allowing only a finite number of levels of output, including a maximum and a minimum output value. The quantization distortion has a non-linear characteristic that gives rise to signal distortions such as harmonics, intermodulation products, and signal correlated noise.

b) Deviations from the ideal response. Deviations from the ideal response can be caused by both the analog front-end devices and the ADC or the components singly or any combination thereof. Deviations from the ideal response include all distortions of the signal other than those caused by quantization. FIG. 3 graphically illustrates deviation between an ideal quantizer response and a non-ideal quantizer response.

c) Additive noise. Additive noise is caused mainly by the analog front-end devices.

While certain distortions, such as harmonics and signal-correlated noise are capable of being removed by linear filtering; however, intermodulation products, present particular difficulties, as intermodulation products are non-linear distortions that cannot be removed by linear filtering techniques.

There have been a number of attempts to reduce the distortions introduced by an ADC system. For instance, a technique known as dithering has been utilized to reduce quantization distortions. For dithering, noise is introduced to the input analog signal, thereby increasing the resolution of small values, allowing distortions caused by the quantization process to be reduced.

In addition, bounding the analog input signal reduces quantization distortions due to the finite dynamic range of the ADC. Other solutions are in the areas of more efficient design and manufacture of ADCs at the chip-level, which help to reduce additive noise and deviations from the ideal response.

Additional techniques such as digital-to-analog feedback and a phase space solution (e.g., using table lookup) have also been implemented. However, the digital-to-analog feedback only works with slow sampling rates, and it requires a digital-to-analog converter's non-linear distortions to be less than the ADC's non-linear distortions. The phase space technique depends strongly on ADC hardware and requires very large tables for ADC systems with memory longer than one tap. While these techniques help to alleviate some of the distortions introduced by ADC systems, there is still a need for better techniques of reducing non-linear distortions introduced into a signal by the analog-to-digital conversion process.

SUMMARY OF THE PRESENT INVENTION

The present invention comprises an analog-to-digital converter ("ADC") and a tunable digital non-linear equalizer connected to the ADC, for reducing the non-linear distortions created by the ADC during an analog-to-digital signal conversion process. The equalizer implements a filtering function, which approximates the inverse of the non-linear distortion introduced into the signal by the ADC such that the overall non-linear distortion of the system is minimized under the constraints of the equalizer structure.

In another embodiment, at least one analog front-end device (e.g. amplifier or RF front-end) is connected to the ADC to perform processing on an analog signal before the signal is provided to ADC. The analog front-end device also creates non-linear distortions during the signal processing. Therefore, in this embodiment, the tunable digital non-linear equalizer is utilized to remove the non-linear distortions created by the analog front-end device, as well as, those created by the ADC.

Preferably, the equalizer is implemented as a Generate Function Streams unit, a plurality of linear finite impulse response ("FIR") filters and a summer. The Generate Function Streams unit generates a plurality of outputs that are non-linear combinations of the ADC output, or, alternatively, combinations of the ADC output and equalizer output. Each of these streams is then passed through a corresponding FIR filter of the plurality of FIR filters. The outputs of the FIR filters are summed by a summer circuit to generate the output of the equalizer. Each of the FIR filters has tunable coefficients. An Identify Coefficients unit, preferably, adaptively sets IQ these coefficients. The coefficients set are identified by the Identify Coefficients unit using a test signal generator.

The test signal generator generates a predetermined functional stream for dynamically setting the FIR filter coefficients due to the change in the surrounding environment (such as thermal change). By supplying the predetermined functional stream to the Identify Coefficients unit, the equalizer coefficients of the plurality of FIR filters are determined through a matrix pseudo-inversion and normalization process.

The present invention further provides a method to compensate for the intermodulations introduced into the signal from the ADC that fall within a particular frequency band of interest. The digitized signal is first up-sampled by a factor of at least half the highest polynomial order of the highest order intermodulation to be removed, so as to prevent equalizer harmonics from being aliased into the frequency band of interest. This up-sampled signal is then shifted by at least half the bandwidth of interest. As a result of this, equalizer harmonics will not fall within the frequency band of interest. After the equalizer equalizes the shifted, up-sampled signal, the equalized signal is shifted back. Any out-of-band harmonics are then removed by linear filtering. Finally, the signal is down-sampled to its original sampling rate.

Other features and advantages of the present invention become apparent to one with ordinary skill in the art upon examination of the following drawings and detailed description. These additional features and advantages are intended to be included herein within the scope of the present invention.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

A brief digression into polynomial difference equation ("PDE") filters, and Volterra filters in particular is first provided to facilitate an understanding of the present invention.

In recent years, PDE filters, and in particular Volterra filters, have been used for non-linear system representations, in large part because the output is a linear function of the filters parameters. While Volterra filters have been advantageous for non-linear system representations, there is a disadvaintage inherent to this filter representation. This disadvantage inherent to the Volterra representation, and other non-linear system representations, is the computational complexity involved in calculating the output. As the polynomial order or memory increases, the number of parameters in the Volterra filter increases rapidly and thus, the number of computations rapidly becomes prohibitive.

Therefore, in order to be computationally efficient, most implementations of Volterra filters have been approximated Volterra filters. There are two dominant approaches for these implementations.

In the first approach, the Volterra filter is approximated using a cascade structure composed of linear filters in series with memory less non-linearities. The output of such cascade structures is not linear in the filter coefficients, and thus determining filter coefficients is a non-linear estimation problem. The second approach is the Tensor product basis approximation, which represents the Volterra filter kernel as a linear combination of Tensor products of simple basis vectors. These approaches, however, still have very complicated non-linearities, which are unknown a priori, are changing with time, and are based on an estimation rather than an exact implementation.

A computationally efficient method for an exact Volterra filter implementation for systems having band-limited inputs is disclosed in an article by G. M. Raz et. al., entitled "Baseband Volterra Filters for Implementing Carrier Based Non-linearities", *IEEE Transactions on Signal Processing*, vol. SP-46, No. 1, pp. 103–115, 1998). In this implementation, the Volterra filter is expressed in terms of a diagonal coordinate system. The output is then generated by a sum of linear filter outputs operating on non-linear combinations of the input.

Figure 1:
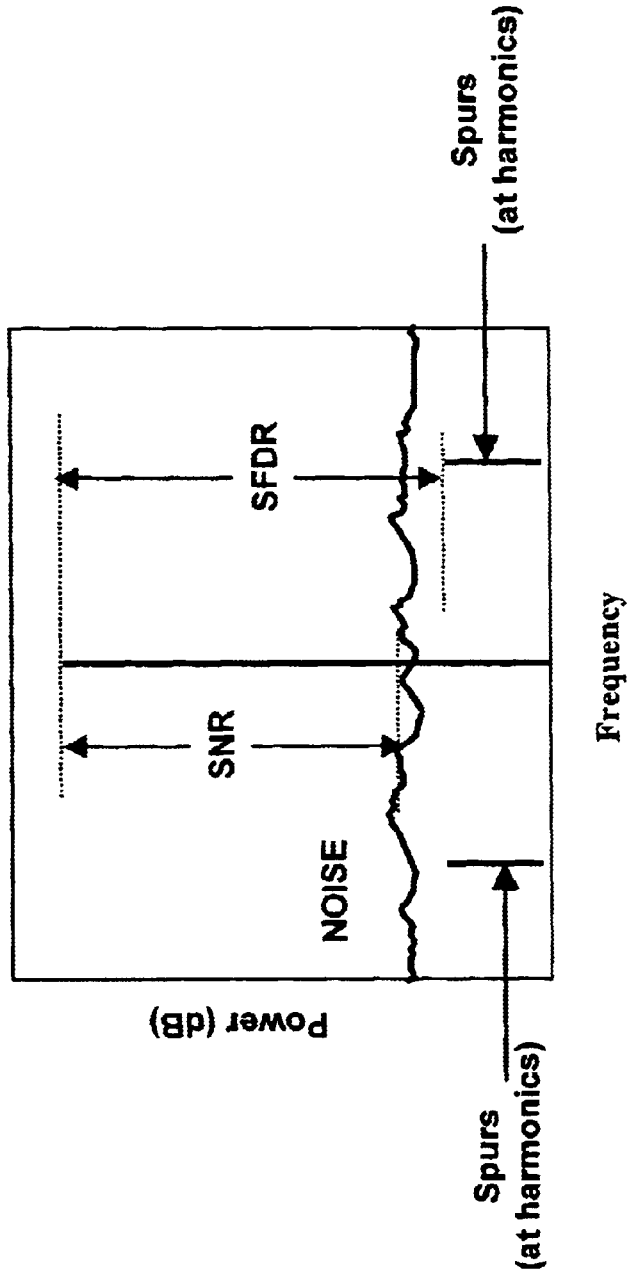
FIG. 1 graphically shows a single tone measurement.
Figure 2:
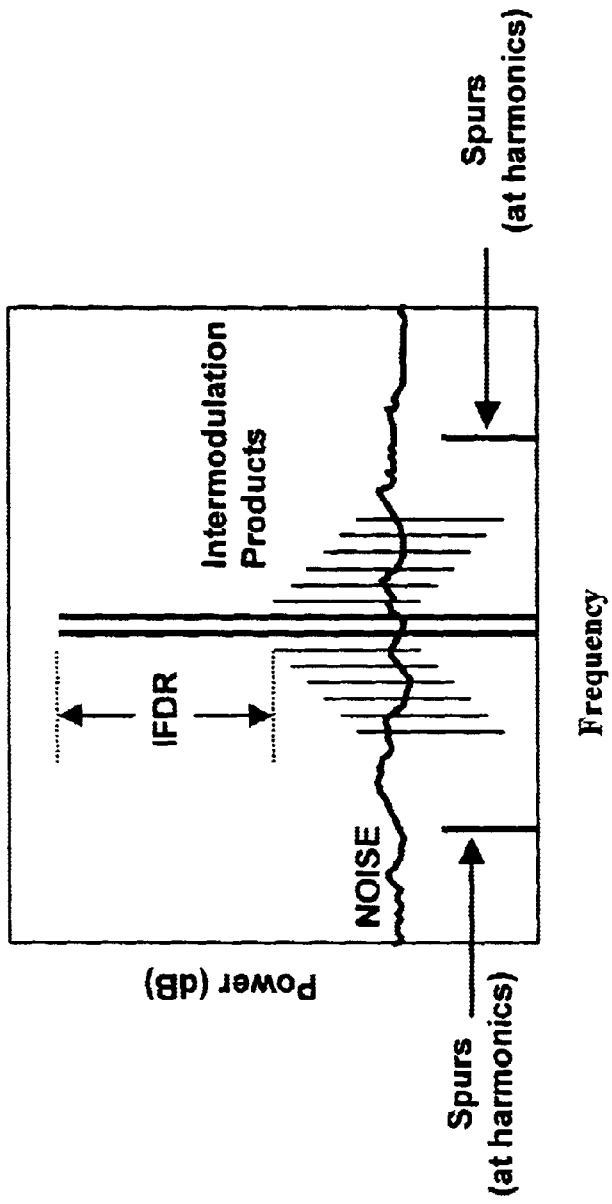
FIG. 2 graphically shows a two tone measurement.
Figure 3:
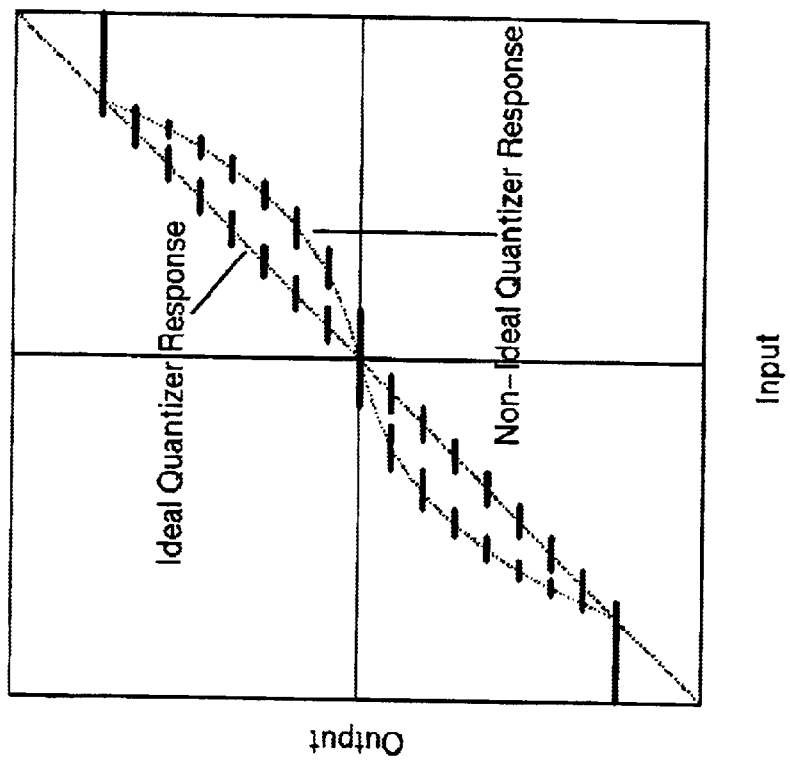
FIG. 3 graphically shows an ideal quantizer response and a non-ideal quantizer response.

As noted above, the present invention is directed to analog to digital conversion systems. The performance of an analog to digital conversion system, as realized by one of ordinary skill in the art, is measured by various metrics. These common metrics include the nominal number of bits used to represent the analog signal, the sampling rate of the analog signal, the signal to noise ratio ("SNR"), the power dispersion, the spur free dynamic range ("SFDR"), and two tone intermod free dynamic range ("IFDR"). Examples of some of these metrics are illustrated in FIGS. 1 and 2. More specifically, FIG. 1 illustrates the signal to noise ratio ("SNR"), the power dispersion, and the spur free dynamic range ("SFDR") metrics, while FIG. 2 illustrates two tone intermod free dynamic range ("IFDR") metric.

With these various metrics, one can characterize the quality of the output so as to determine the distortion in the output signal. As noted above, the distortions present in the ADC's output signal can broadly be categorized as quantization distortion; deviations from the ideal response and additive noise. Again as noted above, of all the possible distortions, intermodulation products, present particular difficulties. Intermodulation products are non-linear distortions that cannot be removed by conventional linear filtering techniques nor have these distortions been successfully reduced or removed by conventional non-linear techniques.

Figure 4:
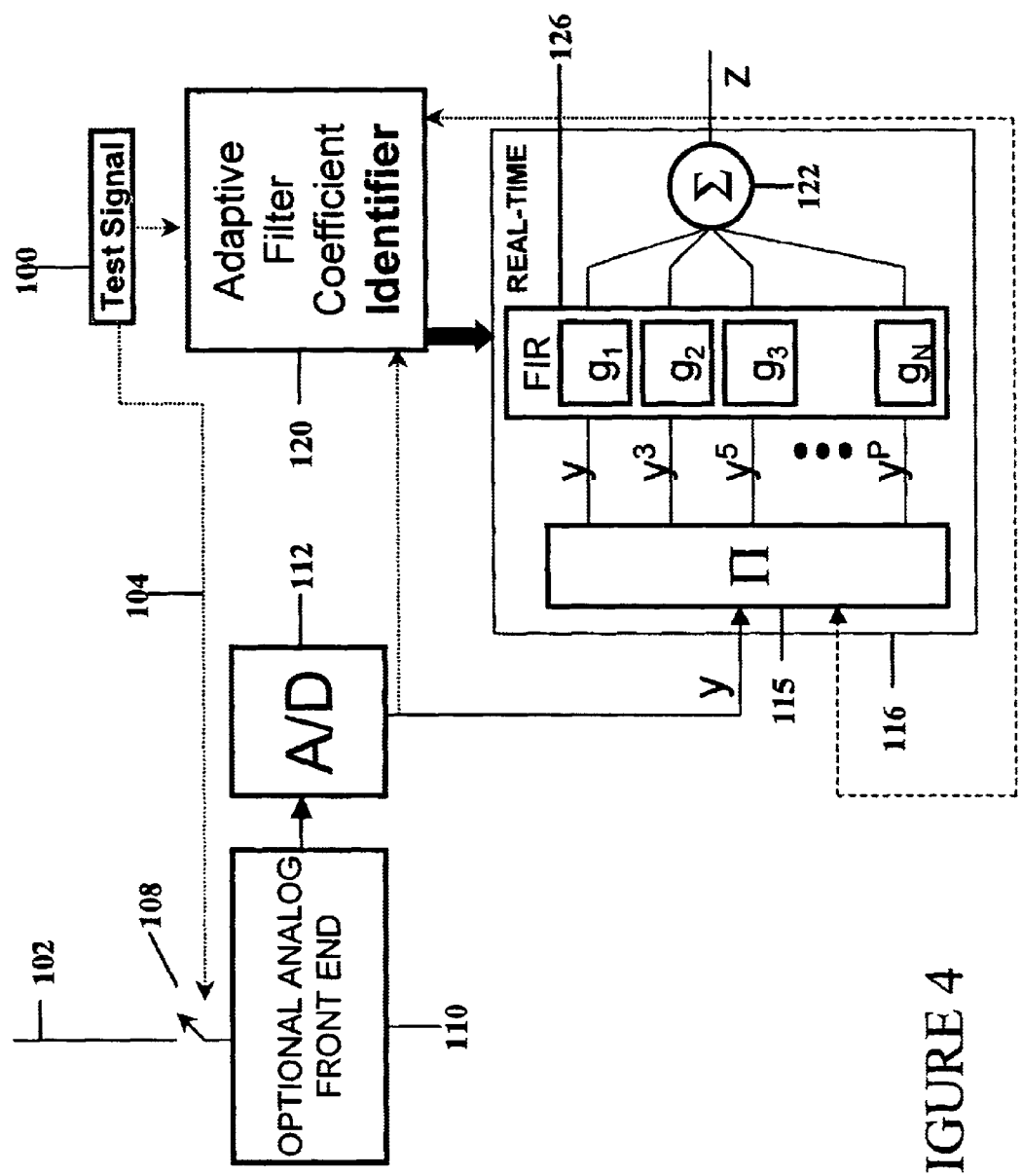
FIG. 4 schematically shows a highly linear analog to digital conversion system according to the present invention.

FIG. 4 shows a highly linear analog-to-digital conversion (HLADC) system, according to the preferred embodiment of the present invention, that reduces non-linear distortions from intermodulation products. The HLADC system comprises a standard ADC 112 followed by a tunable non-linear filter 116. For certain applications, an analog front-end 110, such as a low noise amplifier, precedes ADC 112 to provide appropriate conditioning of the analog input signal 102. Non-linear filter 116 is utilized as an equalizer to equalize the output of ADC 112 such that the overall non-linear distortion introduced by the analog-to-digital conversion process is minimized under the constraints of the equalizer structure. To minimize the non-linear distortion, equalizer 116 implements a function that approximates the inverse of the non-linear distortion created by ADC converter 112. If optional front-end analog circuitry is utilized, the equalizer 116 implements a function that approximates the inverse of the non-linear distortion created by ADC converter 112 and the optional analog front-end 110.

Figure 5:
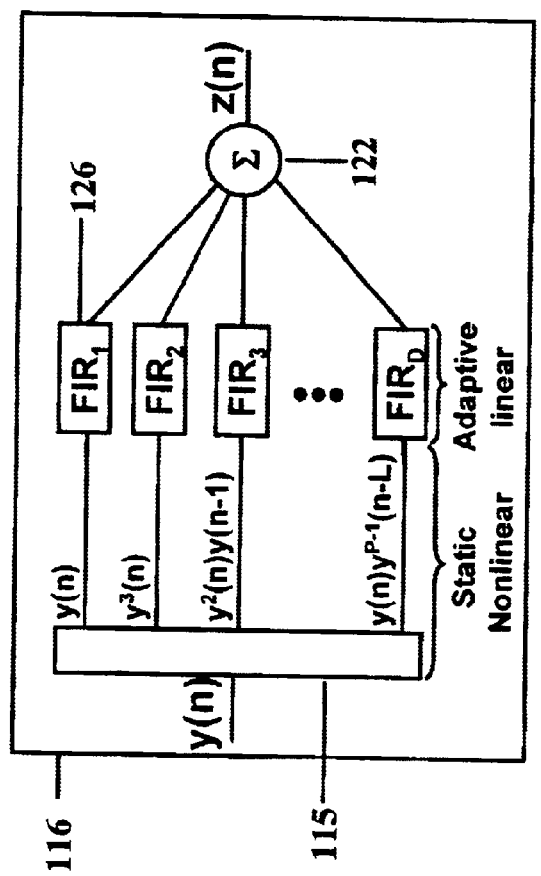
FIG. 5 schematically shows a diagonal coordinate system according to the present invention.

As illustrated in FIG. 5, equalizer 116 comprises a Generate Function Streams unit 115, a plurality of Finite Impulse Response (FIR) filters 126, and at least one summer 122. Generate Function Streams unit 115 generates a plurality of non-linear combinations of ADC 112 output and equalizer 116 output (and the respective delayed samples) or, alternatively, a plurality of non-linear combinations of just ADC 112 output (and the respective delayed samples). These non-linear streams are provided to a corresponding one of a plurality of linear FIR filters 126. Ac summer 122 sums the outputs of FIR filters 126, producing the equalized output with reduced non-linear distortions.

When the non-linear streams are generated in systolic fashion and FIR filters 126 are implemented in systolic fashion as well, equalizer 116 can preferably be implemented using systolic array VLSI architecture. Implementation in a systolic VLSI architecture is advantageous as it allows equalizer 116 to operate in real-time and with a small form factor.

The non-linear streams and the highest polynomial order of streams are chosen a priori for a given ADC architecture. In the case of a Volterra filter form equalizer, a polynomial order at least as high as the one corresponding to the highest polynomial order of the distortion that is above the level of the desired distortion is needed. While possible, it is, however, preferable not to use a higher polynomial order than this due to computational complexity and implementation costs. The memory of the equalizer is also determined from the given ADC architecture and sampling rate.

In the case of a polynomial difference equation equalizer, as known to those skilled in the art, a lower polynomial order will generally suffice since the feedback from the equalizer output produces an overall polynomial order that may be unbounded in principle.

When choosing non-linear streams, an ADC's non-linear distortion in the output can, to a large extent, be viewed as a function of the input signal 102 and its first derivative or equivalently a function of the present sample and one previous sample of the input 102. Hence, using a series of two or three sinusoidal inputs at a time can excite most of the relevant modes of the non-linear distortion present in ADC 112. Therefore, one method of determining the polynomial order of streams is to provide a series of two or three sinusoidal inputs at a time to ADC 112 and measuring the output thereof.

Using the knowledge of the frequencies of this input and by observing the output, the level of the intermodulation and harmonic interference caused by the ADC's non-linearity is determined. Using this information, the highest polynomial order of the distortion above the desired distortion level is found.

Figure 6:
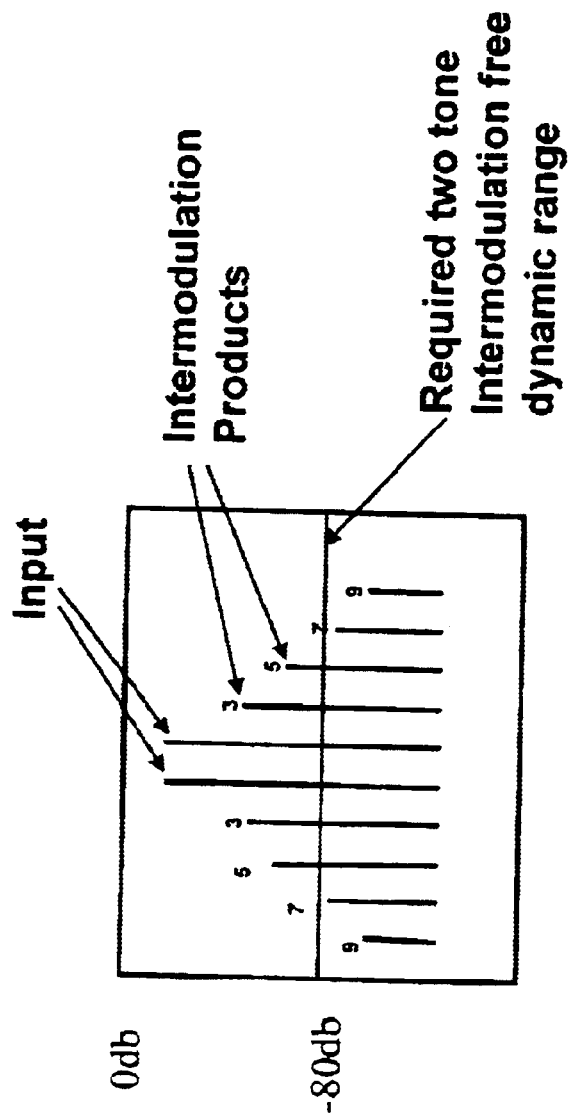
FIG. 6 graphically shows intermodulation products of a two tone input.

FIG. 6 provides an example of determining the appropriate polynomial order of the v; by inspection. Noting that intermodulation products of a carrier-based input are produced only by odd order non-linearities, when two input tones at frequencies $f_0 \pm \Delta f/2$ are input to ADC 112, the intermodulation products are produced at frequencies $f_0 + k\Delta f/2$, where k is the order of the polynomial expansion term causing the given spurious noise. As shown, intermodulation products are produced for odd k (3, 5, 7, etc.).

If, for example, it is desired to reduce intermodulation products to a level of −80 dB below the maximum signal strength allowed by the dynamic range of ADC 112, it can be observed from the output that the intermodulation product of order 5 is the highest polynomial order which produces an intermodulation product stronger than −80 dB. Hence, for a Volterra representation, the $v_i$ are chosen as non-redundant monomials with a highest polynomial order of 5 so as to reduce intermodulations up to the 5th order.

Once the non-linear streams are determined, the coefficients of the FIR filters 126 are then chosen, preferably adaptively, so as to minimize an error function relating to the desired output for the given choice of streams. The determination of the appropriate filter coefficients is described below in conjunction with Identify Equalizer Coefficients unit 120.

Generally, the equalizer's 116 function can be described as a functional series whose output at time n is:

$$z(n) = \sum_{i=1}^{N_f} f_i(y(n-N_u), y(n-N_y+'1), \qquad (1)$$
$$\ldots, y(n), z(n-Z_z), z(n-N_z+1), \ldots, z(n-1)),$$

where $N_f$ represents the number of functions $f_i$ in the series, and the integers $N_y$, $N_z$ represent the time range of interest for the parameters of the functions. Optimal values for these integers for specific system performance are determined during a coefficient identification process or stage. The symbol y(n) in FIG. 5 represents the unequalized output of ADC 112 at time n, and z(n) represents the equalized signal at the same time instant. Due to latency in the system, the value of z(n) corresponds to a delayed value y(n-delay).

Equalizer 116 is implemented utilizing a set of polynomial (or monomial) functions $f_i$ on the parameters $y(n-N_y)$, $y(n-N_y+1), \ldots, y(n), z(n-N_z), z(n-N_z+1), \ldots, z(n-1)$, or, alternatively only on the parameters $y(n-N_y), y(n-N_y+1), \ldots, y(n)$. In the first case, equalizer 116 is a polynomial difference equation ("PDE") equalizer, while, in the second case, the equalizer is a Volterra Filter ("VF").

While there are a number of techniques for implementing PDEs and specifically VFs, the preferred embodiment of the present invention utilizes an implementation known as the diagonal coordinate system (DCS). In this form, the functions $f_i$ become:

$$f_i = (v_i * h_i)(n).$$

Therefore, as further described in "Baseband Volterra Filters for Implementing Carrier Based Non-linearities", *IEEE Transactions on Signal Processing*, vol. SP-46, no. 1 pp. 103–115, 1998, the output of a VF in a DCS implementation is:

$$z(n) = \sum_{i=1}^{N_f} (v_i * h_i)(n),$$

where * denotes the one-dimensional linear convolution operator, $h_i$ are the coefficients of FIR filters, and $v_i$ are non-linear functions of the parameters $y(n-N_y)$, $y(n-N_y+1), \ldots, y(n)$ such that $v_i(n)$ is not identical to $v_j(n-D)$ for all D when i j. This implementation is extensible to a PDE implementation by making the $v_i$ non-linear functions of the output parameters $z(n-N_z)$, $z(n-N_z+1), \ldots, z(n-1)$ in addition to the input parameters $y(n-N_y), y(n-N_y+1), \ldots, y(n)$.

An example of appropriate functions for the $v_i$ is illustrated in the following table:

|  | PDE |
|---|---|
| $v_1(n)$ | $y(n)$ |
| $v_2(n)$ | $y(n)^3$ |
| $v_3(n)$ | $y(n)^2 y(n-1)$ |
| $v_4(n)$ | $z(n)$ |

| | PDE |
|---|---|
| $v_5(n)$ | $z(n)^3$ |
| $v_6(n)$ | $y(n)^2 z(n)$ |

Accordingly, a method of reducing the non-linear distortions introduced by an ADC is provided. First, a plurality of non-linear combinations of the ADC output and the equalizer output (and their delayed samples) for a PDE implementation, or a plurality of non-linear combinations of just the ADC output (and their delayed samples) for a Volterra implementation, are generated in a systolic form such that only non-redundant terms are generated. Preferably, when practically implementing the equalizer, monomial or polynomial forms are chosen for these non-linear combinations that are especially easy to implement. However, other non-monomial or non-polynomial forms may be chosen and are considered within the scope of the present invention.

Each of these non-linear streams is then filtered via a corresponding finite impulse response filter (FIR) 126. Finally, the outputs of the FIR filters 126 are summed together. The non-linear combinations and coefficients of the FIR filters 126 are chosen to minimize the non-linear distortions introduced by the ADC 112 (as described below).

As illustrated in FIG. 4, the HLADC system also includes a test signal generator 100 of analog and digital test signals and an Identify Equalizer Coefficients unit 120, which determines the tunable coefficients of the equalizer 116 in order to reduce the non-linear distortions created by the ADC converter 112 and the analog front-end device 110 to a satisfactory level.

Equalizer 116, implemented in the DCS form, can, to a large extent, be viewed as a multiple input single output ("MISO") linear system for which non-linear streams are the inputs. This allows standard system identification techniques to be used in order to determine the coefficients of FIR filters 126 that minimize an error function.

One possible identification technique is a least-squares solution that minimizes the error function $$e = \Sigma_n z(n) - x(n-\text{delay})^2$$

wherein x (n−delay) is a delay input signal from test signal generator 100.

It should be noted that, there are, however, several differences between this system and a general MISO system:
a). The non-linear streams are highly correlated.
b). There is no control over non-linear streams directly, rather only control over the test signal.
c). Furthermore, in the case of monomial form non-linear streams, there is a potentially severe numerical accuracy problem, when using finite accuracy numerical representations, since the maximum of $|v_i|$ may be several orders of magnitude stronger then that of $|v_j|$ for some i and j.
d). During the coefficient identification stage, the desired output of equalizer 116, which is the test signal input of the ADC 112, is unavailable in digital form. Therefore input test signals 104, which although analog, are required to be known with great accuracy without being measured.

The coefficients of FIR filters 126 are determined such that they minimize the least-squares error of e for the given choice of non-linear streams.

In vector-matrix form, the desired output of equalizer 116 is $$x = Sh$$

Where x denotes the column vector whose entries are the outputs x(1), . . . , x (Nsamples), $$S = [T(v_1) T(v_2) \ldots T(v_{Nf})],$$

and $$h = \begin{matrix} h_1 \\ h_2 \\ \cdot \\ \cdot \\ \cdot \\ h_N \end{matrix}$$

where T[$v_i$] denotes a Toeplitz matrix (or a Hankel matrix) whose first column is $v_i(1), \ldots, v_i$(Nsamples) and which has a number of columns equal to the length of FIR filters 126; the symbol h denotes the column vector whose entries are the FIR filter coefficients.

The filter coefficients h which yield the least-squares optimal solution are then found from $$h = S\# \bar{x},$$

where the symbol # denotes the pseudo-inverse of a matrix.

Prior to finding the pseudo-inverse of S, the sequence y and $\bar{x}$ are preferably normalized such that the signals $v_i$ yield a matrix S of minimal condition number. Generally, this normalization would not help the condition number for a linear system, however, since the $v_i$ (non-linear streams) are related non-linearly to each other, normalization increases the numerical stability of the inversion process.

Preferably, the inversion is performed using orthogonal techniques such as QR decomposition to further minimize any problems of numerical stability.

Once the filter coefficients are determined, an optimal FIR filter coefficient representation needs to formulated. There are various ways of constructing such a representation. One example, residue algebra, is illustrated in FIG. 7.

Figure 7:
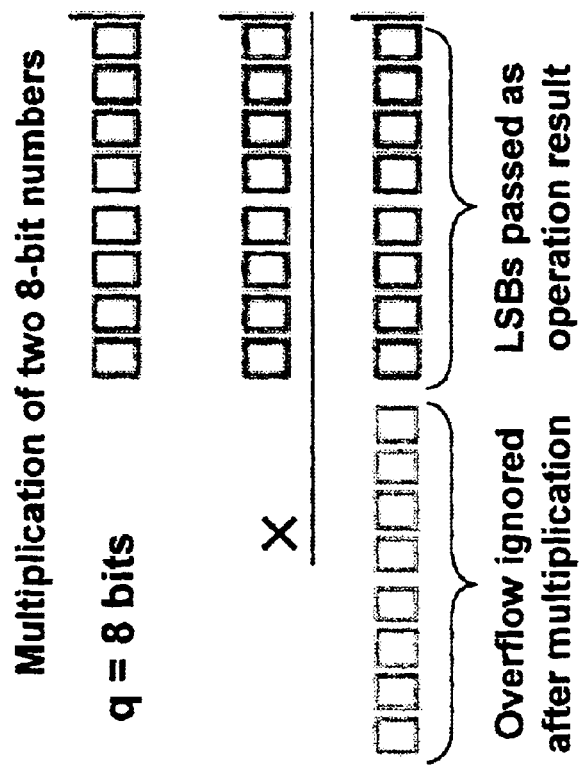
FIG. 7 graphically shows an example of residue algebra.

As illustrated in FIG. 7, a residue algebraic approach allows overflow bits to be ignored in the intermediate results when adding and multiplying. In this approach all inputs, outputs, and filter coefficients of the system are representable by 'q' bits, and all overflow bits in the intermediate results are cancelled out. No errors are introduced by ignoring the overflow bits and the process does not require any extra accumulator bits. However, this residue algebra technique produces large ratios between filter coefficients, thereby requiring a large number of bits for representation.

Figure 8:
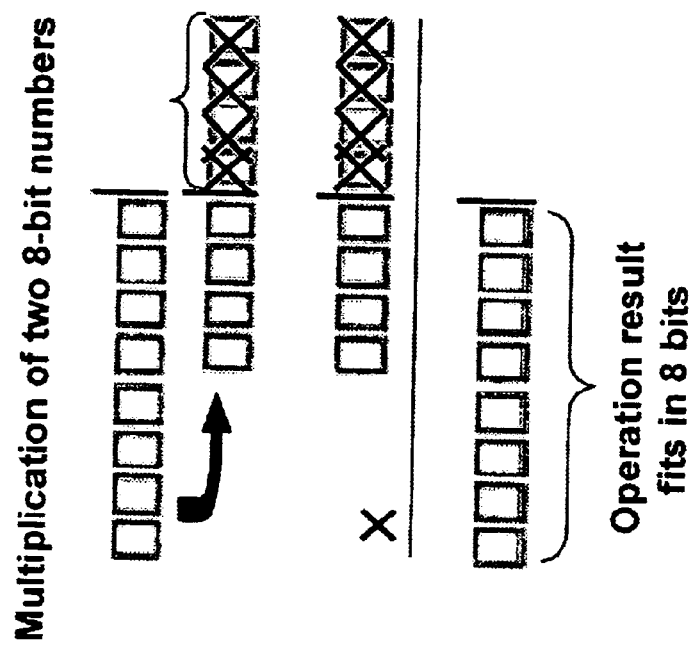
FIG. 8 graphically shows an example of bit-shift multiplication.

Another way of constructing the representation is bit-shift multiplication as illustrated in FIG. 8. In this technique, the number of bits necessary for representation is reduced by right shifting the bits by q/2 bits before multiplication. This puts a constraint upon the multiplication product to q bits. In this approach, multiplication products never overflow, thereby reducing the need for additional accumulator bits. Also, this approach reduces the bits necessary for filter coefficient representation; however, the rounding errors are substantial and cumulative.

Figure 9:
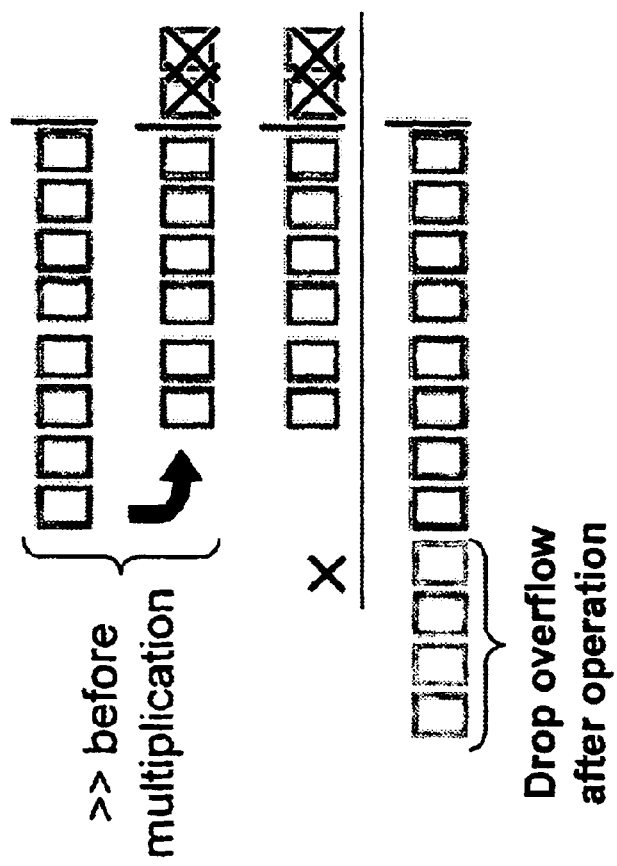
FIG. 9 graphically shows an example of bit-shift multiplication and residue algebra.

In the present invention, a combination of both of the above approaches is utilized to construct a filter coefficient representation, as illustrated by FIG. 9. In the preferred approach, the number of bits necessary for representation is reduced by right shifting the bits by less than q/2 bits before multiplication. Thereafter, residue algebra is used to ignore the overflow bits. Using this combined approach the filter coefficient representation can be optimally determined.

In the preferred embodiment, a 7-bit right shift was determined to be optimal for FIR filter coefficient representation for a 16-bit system. Also the 7-bit right shift provided the maximum Intermod-Free Dynamic Range, resulting in ~18 dB Intermod-Free Dynamic Range improvement.

The test signal generator 100 generates test signals 104 that are both sufficiently exciting in terms of the non-linear distortion of ADC 112 and which have a dynamic range on the order of the weakest intermodulation and harmonic distortion products to be equalized. Due to the nature of the ADC's non-linearity, a sequence of two or more tones at several frequencies within the band of interest sufficiently excites all the relevant modes of the ADC's non-linearity. It is well within the capabilities of one skilled in the art to design such a signal generator, which produces signals constructed of few tones with high dynamic range compared with more complicated signals.

A non-linear polynomial type equalizer 116 produces both intermodulations and harmonics, which equalize the non-linear distortions of the ADC 112. However, when using base-band data of a carrier-based signal, equalizer 116 produces harmonics that are within the baseband version of the signals spectrum, or that get aliased back therein. The harmonics are not at the same frequencies as the harmonics introduced by ADC 112. Therefore, equalizer 116 actually introduces harmonics which produce distortion products on the same order of magnitude as the ADC 112 harmonics, rather than equalizing out these harmonics introduced by ADC 112. The intermodulation products generated by equalizer 116 in this case, however, are generated at the frequencies of the intermodulation distortions from ADC 112. Therefore, in some is applications there is a need to reduce intermodulation products falling within a particular frequency band of interest (in-band) resulting from in-band and out-of-band signals, without reducing harmonics that fall out of the frequency band of interest. This happens, for example, when ADC 112 is an oversampling ADC 112 and input 102 is carrier-based.

Figure 10:
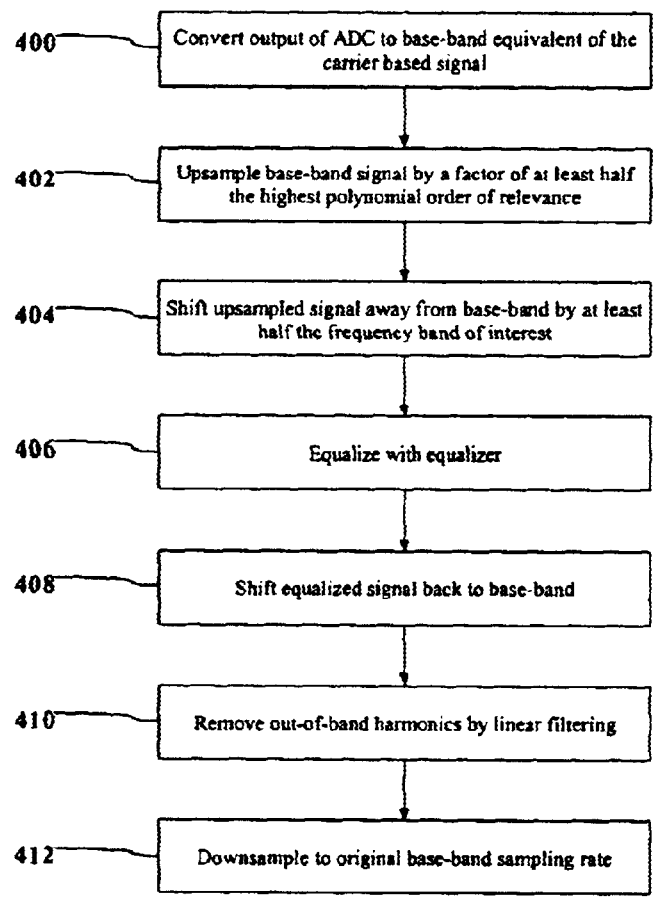
FIG. 10 illustrates a method to compensate for the intermodulations within a particular frequency band of interest according to the concepts of present invention.

FIG. 10 illustrates a method to compensate for the intermodulations that fall in-band 20 but not the harmonics which fall out-of-band. In the case of a carrier-based input, the output of ADC is first converted to a base-band equivalent of the carrier-based signal, at Step 400. Next, the base-band data is upsampled by a factor of at least half the highest polynomial order of relevance, as described previously, thus avoiding harmonics from being aliased into the band of interest, at Step 402. The upsampled signal is then shifted away from the base-band by at least half the bandwidth of interest, at Step 404, thus ensuring that equalizer harmonics that would fall in-band are generated out-of-band. Consequently, the harmonics that will be generated by equalizer 116 will not fall within the frequency band of interest. After this shifted, upsampled signal is equalized by equalizer, at Step 406, the equalized signal is shifted back to base-band, at Step 408. Any out-of-band harmonics, whether introduced by equalizer 116 or ADC 112, are then removed by linear filtering, at Step 410. Finally, the signal is downsampled to its original base-band sampling rate, at Step 412.

In addition to being performed for equalization, this procedure is also done for the coefficient identification stage. During the identification stage, test signal 104 as well as ADC output is upsampled and shifted. Identification itself is preferably done only with the data within the band of interest whether it is upsampled and shifted or not. This is accomplished by converting ADC's output 114 and the test signals into the frequency domain via a Fast Fourier transform (FFT). Vectors and matrices used for identification are then created from frequency domain data rather than time domain data.

Preferably, frequency domain identification and equalization with upsampling and shifting is done with minimal computational complexity by using zero padding in the out-of-band frequencies and the subsequent shifting and downsampling is accomplished by brute force truncation of the frequency domain data sequences such that only the band of interest remains.

Although the present invention has been shown and described with respect to several preferred embodiments thereof, various changes, omissions and additions to the form and detail thereof, may be made therein, without departing from the spirit and scope of the present invention.

What is claimed is:

1. A highly linear Analog-to-Digital conversion system to convert analog signals to digital signals having reduced non-linear distortions, said system comprising:

an analog-to-digital converter, said analog-to-digital converter receiving an input analog signal and converting said input analog signal to a digital signal; and a non-linear equalizer coupled to an output of said analog-to-digital converter to receive said digital signal, said non-linear equalizer generating an equalized digital signal by adaptively reducing non-linear distortions in said digital signal resulting from said analog-to-digital converter converting said input analog signal to said digital signal;

said non-linear equalizer including, a generate function streams unit, said generate function streams unit generating a plurality of functional streams, said functional streams comprising non-linear combinations of said digital signal, a plurality of finite impulse response filters, each of said finite impulse response filters receiving a corresponding one of said functional streams and generating a filtered output of said corresponding functional stream, and at least one summer, said at least one summer summing said filtered outputs of said finite impulse response filters to output said equalized digital signal.

2. The system as per claim 1, wherein said functional streams further comprise non-linear combinations of said equalized digital signal.

3. The system as per claim 1, wherein said functional streams are generated in one of a monomial or polynomial form.

4. The system as per claim 3, wherein said equalizer is implemented using a systolic array VLSI architecture.

5. The system as per claim 1, wherein a polynomial order of said functional streams is at least as high as the highest polynomial order at which intermodulation distortion in said digital signal is above a predetermined level.

6. The system as per claim 1, wherein said generate function streams unit generates said streams in a combinable systolic form such that only non-redundant terms are generated.

7. The system as per claim 1, said system further comprising:

an analog front-end device connected to an input of said analog-to-digital converter, said analog front-end device conditioning said input analog signal prior to providing said input analog signal to said analog-to-digital converter.

8. A method to compensate for the intermodulations, comprising the steps of:
(a) converting an output of an analog to digital converter to a base-band equivalent of a carrier-based signal;
(b) upsampling the base-band data;
(c) shifting the base-band of the upsampled signal;
(d) equalizing the shifted signal;
(e) shifting the equalized signal back to its original base-band;
(f) linearly filtering the shifted signal of said step (e); and
(g) downsampling the filtered signal.

9. The method as claimed in claim 8, wherein the base-band of the upsampled signal is shifted by at least half the bandwidth.

10. The method as claimed in claim 8, wherein the base-band of the upsampled signal is shifted by half the bandwidth.

11. The method as claimed in claim 8, wherein the base-band data is upsampled by a factor of at least half the highest polynomial order.

12. The method as claimed in claim 8, wherein the base-band data is upsampled by a factor of one half the highest polynomial order.

13. A method for converting analog signals to digital signals having reduced non-linear distortions, comprising the steps of:
(a) receiving an input analog signal;
(b) converting the input analog signal to a digital signal; and
(c) generating an equalized digital signal by adaptively reducing non-linear distortions in the digital signal;
said step (c) including the substeps of,
(c1) generating a plurality of functional streams, the functional streams comprising non-linear combinations of the digital signal,
(c2) generating a filtered output, using a plurality of finite impulse response filters, of the corresponding functional stream, and
(c3) summing the filtered outputs of the finite impulse response filters to output the equalized digital signal.

14. A method for producing an equalized digital signal from a digital signal having non-linear distortions therein, comprising:
(a) converting the digital signal having non-linear distortions therein into a converted digital signal having a number of dimensions greater than a number of dimensions of the digital signal having non-linear distortions therein; and
(b) filtering non-linear distortions from the digital data using a linear filter, the linear filter having a number of dimensions greater than a number of dimensions of the digital signal having non-linear distortions.

15. The method as claimed in claim 14, wherein the higher dimensional linear filter is a plurality of parallel linear finite impulse response filters.

16. The method as claimed in claim 15, further comprising:
(c) adaptively identifying filter coefficients for the plurality of parallel linear finite impulse response filters.

17. The method as claimed in claim 15, wherein each linear finite impulse response filter uses a bit-shift multiplication operation to produce a filtered digital signal.

18. The method as claimed in claim 15, wherein each linear finite impulse response filter drops all overflow bits after a multiplication operation to produce a filtered digital signal.

19. The method as claimed in claim 15, wherein each linear finite impulse response filter uses a bit-shift operation prior to a multiplication operation and drops all overflow bits after the multiplication operation to produce a filtered digital signal.

20. The method as claimed in claim 19, wherein the bit-shift operation right shifts a digital signal by q/2 bits or fewer, q being a number of bits in a digital signal.

21. The method as claimed in claim 19, wherein the bit-shift operation right shifts a digital signal by fewer than q/2 bits, q being a number of bits in a digital signal.

22. A method for producing an equalized digital signal from a digital signal having non-linear distortions therein, comprising:
(a) converting the digital signal having non-linear distortions therein into a plurality of parallel non-linear digital signals; and
(b) filtering non-linear distortions from the digital data using a linear filter, the linear filter having a number of dimensions greater than a number of dimensions of the digital signal having non-linear distortions.

23. The method as claimed in claim 22, wherein the higher dimensional linear filter is a plurality of parallel linear finite impulse response filters such that each parallel non-linear digital signal is filtered by a linear finite impulse response filter.

24. A method for producing an equalized digital signal from a digital signal having non-linear distortions therein, comprising:
(a) converting the digital signal having non-linear distortions therein into a plurality of monomial combinations of the digital signal having non-linear distortions therein to generate a plurality of systolic form digital signals without redundant terms; and
(b) filtering non-linear distortions from the digital data using a linear filter, the linear filter having a number of dimensions greater than a number of dimensions of the digital signal having non-linear distortions.

25. The method as claimed in claim 24, wherein the higher dimensional linear filter is a plurality of parallel linear finite impulse response filters such that each systolic form digital signal is filtered by a linear finite impulse response filter.

26. A method for producing an equalized digital output from an analog input, comprising:
(a) converting an analog input into digital data, the digital data having a first domain, the first domain having a first number of dimensions;
(b) converting the digital data into a second domain, the second domain having a second number of dimensions, the second number of dimensions being greater than the first number of dimensions;
(c) linearly filtering the converted digital data; and
(d) converting the linearly filtered digital data into the equalized digital signal having a domain having the first number of dimensions.

27. The method as claimed in claim 26, wherein the digital data of the second domain is composed of a plurality of parallel non-linear digital signals.

28. The method as claimed in claim 27, wherein each parallel non-linear digital signal is filtered by a separate linear finite impulse response filter.

29. A communication system, comprising:
a transmitter for transmitting an analog signal at saturation, the analog signal having non-linear distortions therein;

a receiver for receiving the transmitted analog signal;

an analog to digital converter circuit to convert the analog signal into a digital signal; and a non-linear equalizing circuit to remove non-linear distortions from the digital signal;

said non-linear equalizing circuit including, a circuit to convert the digital signal having non-linear distortions therein into a plurality of monomial combinations of the digital signal having non-linear distortions therein to generate a plurality of systolic form digital signals without redundant terms, and a plurality of parallel linear finite impulse response filters such that each systolic form digital signal is filtered by a linear finite impulse response filter.

30. The communication system as claimed in claim 29, wherein said non-linear equalizing circuit further includes:

a summer for summing the filtered digital signal to produce an equalized digital signal.

31. A communication system, comprising:

a transmitter for transmitting an analog signal at saturation, the analog signal having non- linear distortions therein;

a receiver for receiving the transmitted analog signal;

an analog to digital converter circuit to convert the analog signal into a digital signal; and a non-linear equalizing circuit to remove non-linear distortions from the digital signal;

said non-linear equalizing circuit including, a circuit to convert the digital signal having non-linear distortions therein into a plurality of parallel non-linear digital signals, and a plurality of parallel linear finite impulse response filters such that each parallel non-linear digital signal is filtered by a linear finite impulse response filter.

32. A communication system, comprising:

a transmitter for transmitting an analog signal at saturation, the analog signal having non-linear distortions therein;

a receiver for receiving the transmitted analog signal;

an analog to digital converter circuit to convert the analog signal into a digital signal; and a non-linear equalizing circuit to remove non-linear distortions from the digital signal;

said non-linear equalizing circuit including, a first circuit to convert the digital signal, having non-linear distortions and being of a first domain, into a second domain, the second domain having a number of dimensions, the number of dimensions being greater than the number of dimensions in the first domain, a filter to linearly filter the converted digital signal, and a second circuit to convert the linearly filtered digital signal into a equalized digital signal being of a domain having the first number of dimensions.

33. An analog receiver, comprising:

an analog to digital converter circuit to convert a received analog signal into a digital signal; and a non-linear equalizing circuit to remove non-linear distortions from the digital signal;

said non-linear equalizing circuit including, a circuit to convert the digital signal having non-linear distortions therein into a plurality of monomial combinations of the digital signal having non-linear distortions therein to generate a plurality of systolic form digital signals without redundant terms, and a plurality of parallel linear finite impulse response filters such that each systolic form digital signal is filtered by a linear finite impulse response filter.

34. An analog receiver, comprising:

an analog to digital converter circuit to convert a received analog signal into a digital signal; and a non-linear equalizing circuit to remove non-linear distortions from the , digital signal;

said non-linear equalizing circuit including, a circuit to convert the digital signal having non-linear distortions therein into a plurality of parallel non-linear digital signals, and a plurality of parallel linear finite impulse response filters such that each parallel non-linear digital signal is filtered by a linear finite impulse response filter.

35. An analog receiver, comprising:

an analog to digital converter circuit to convert a received analog signal into a digital signal; and a non-linear equalizing circuit to remove non-linear distortions from the digital signal;

said non-linear equalizing circuit including, a first circuit to convert the digital signal, having non-linear distortions and being of a first domain, into a second domain, the second domain having a number of dimensions, the number of dimensions being greater than the number of dimensions in the first domain, a filter to linearly filter the converted digital signal, and a second circuit to convert the linearly filtered digital signal into a equalized digital signal being of a domain having the first number of dimensions.

36. A digital equalizer for removing non-linear distortions, comprising:

a first circuit to convert a digital signal, having non-linear distortions and being of a first domain, into a second domain, the second domain having a number of dimensions, the number of dimensions being greater than the number of dimensions in the first domain;

a filter to linearly filter the converted digital signal; and a second circuit to convert the linearly filtered digital signal into a equalized digital signal being of a domain having the first number of dimensions.

37. The digital equalizer as claimed in claim 36, further comprising:

a coefficient circuit to adaptively identify filter coefficients for said non-linear equalizing circuit.

38. A digital equalizer for removing non-linear distortions, comprising:

a circuit to convert a digital signal having non-linear distortions therein into a plurality of parallel non-linear digital signals; and a plurality of parallel linear finite impulse response filters such that each parallel non-linear digital signal is filtered by a linear finite impulse response filter.

39. The digital equalizer as claimed in claim 38, further comprising:

a coefficient circuit to adaptively identify filter coefficients for said non-linear equalizing circuit.

40. A digital equalizer for removing non-linear distortions, comprising:

a circuit to convert a digital signal having non-linear distortions therein into a plurality of monomial combinations of the digital signal having non-linear distortions therein to generate a plurality of systolic form digital signals without redundant terms; and a plurality of parallel linear finite impulse response filters such that each systolic form digital signal is filtered by a linear finite impulse response filter.

41. The digital equalizer as claimed in claim 40, further comprising:

a summer for summing the filtered digital signal to produce an equalized digital signal.

42. The digital equalizer as claimed in claim 40, further comprising:

a coefficient circuit to adaptively identify filter coefficients for said non-linear equalizing circuit.

43. A method for linearly filtering a digital signal, comprising:

(a) bit-shifting a digital signal;

(b) multiplying the bit-shifted digital signal by a predetermined coefficient; and (c) eliminating all overflow bits after the multiplication operation to produce a filtered digital signal.

44. The method as claimed in claim 43, wherein the bit-shift operation right shifts the digital signal by q/2 bits or fewer, q being a number of bits in the digital signal.

45. The method as claimed in claim 43, wherein the bit-shift operation right shifts the digital signal by fewer than q/2 bits, q being a number of bits in the digital signal.

46. A linear finite impulse response filter, comprising:

a shift register to bit-shift a digital signal;

a multiplier to multiply the bit-shifted digital signal by a predetermined coefficient; and an algebraic residual circuit to eliminate all overflow bits after the multiplication operation to produce a filtered digital signal.

47. The linear finite impulse response filter as claimed in claim 46, wherein said shift register shifts the digital signal by q/2 bits or fewer, q being a number of bits in the digital signal.

48. The linear finite impulse response filter as claimed in claim 46, wherein said shift register shifts the digital signal by fewer than q/2 bits, q being a number of bits in the digital signal.

* * * * *

UNITED STATES PATENT AND TRADEMARK OFFICE
CERTIFICATE OF CORRECTION

PATENT NO. : 6,639,537 B1
DATED : October 28, 2003
INVENTOR(S) : Raz

It is certified that error appears in the above-identified patent and that said Letters Patent is hereby corrected as shown below:

<u>Column 1,</u>
Line 10, please insert the following:
-- SPONSORSHIP INFORMATION
This invention was made with government support under Contract Number F19628-95-C-0002, awarded by the Air Force. The government has certain rights in the invention. --

Signed and Sealed this

Twenty-third Day of December, 2003

JAMES E. ROGAN
*Director of the United States Patent and Trademark Office*